(12) United States Patent
Choi

(10) Patent No.: US 10,666,128 B1
(45) Date of Patent: May 26, 2020

(54) METHODS, SYSTEMS, APPARATUSES AND DEVICES FOR REGULATING AN OUTPUT OF A SWITCHED MODE POWER SUPPLY CIRCUIT CONFIGURED TO PROVIDE ELECTRIC POWER TO A LOAD

(71) Applicant: Eric Seungwoo Choi, Saratoga, CA (US)

(72) Inventor: Eric Seungwoo Choi, Saratoga, CA (US)

( * ) Notice: Subject to any disclaimer, the term of this patent is extended or adjusted under 35 U.S.C. 154(b) by 0 days.

(21) Appl. No.: 16/433,205

(22) Filed: Jun. 6, 2019

(51) Int. Cl.
*H02M 1/14* (2006.01)
*H03M 1/08* (2006.01)
*H02M 3/158* (2006.01)

(52) U.S. Cl.
CPC .......... *H02M 1/14* (2013.01); *H02M 3/1584* (2013.01); *H03M 1/0845* (2013.01); *H02M 2003/1586* (2013.01)

(58) Field of Classification Search
CPC ................. H02M 1/14; H02M 3/1584; H02M 2003/1586; H03M 1/0845
USPC .................................................. 341/118, 155
See application file for complete search history.

(56) References Cited

U.S. PATENT DOCUMENTS

| | | | |
|---|---|---|---|
| 4,618,919 A | 10/1986 | Martin, Jr. | |
| 5,796,596 A * | 8/1998 | Williams | H02H 7/1257 363/21.16 |
| 6,534,962 B1 | 3/2003 | Lee | |
| 6,853,564 B2 * | 2/2005 | Kravitz | H02M 1/10 363/44 |
| 6,987,333 B2 * | 1/2006 | Winick | H02J 1/102 307/85 |
| 7,893,678 B2 | 2/2011 | Blanken | |
| 8,773,099 B2 | 7/2014 | Granger | |
| 9,041,364 B2 | 5/2015 | Khlat | |
| 9,484,797 B2 | 11/2016 | Khlat | |

FOREIGN PATENT DOCUMENTS

GB 2462204 A 2/2013

* cited by examiner

*Primary Examiner* — Brian K Young

(57) ABSTRACT

A system for regulating an output of a switched mode power supply circuit is configured to provide electric power to a load. The system may include a filter circuit. The filter circuit may be configured to suppress ripple signals at the power output. The system may include a feedback sense circuit including at least one feedback input end and at least one feedback output end. The feedback sense circuit may be configured for generating a feedback signal based on an output ripple signal at a filter input end and a DC regulation signal at a filter output end. The at least one feedback output end may be configured to be electrically coupled to the switched mode power supply circuit. Further, a switching of the switched mode power supply circuit may be based on the feedback signal.

20 Claims, 21 Drawing Sheets

METHODS, SYSTEMS, APPARATUSES AND DEVICES FOR REGULATING AN OUTPUT OF A SWITCHED MODE POWER SUPPLY CIRCUIT CONFIGURED TO PROVIDE ELECTRIC POWER TO A LOAD

FIELD OF THE INVENTION

Generally, the present disclosure relates to the field of power supply or regulation systems. More specifically, the present disclosure relates to methods, systems, apparatuses and devices for regulating an output of a switched mode power supply circuit configured to provide electric power to a load.

BACKGROUND OF THE INVENTION

When using a high-performance analog-to-digital converter (ADC) or digital-to-analog converter (DAC) in a sampling or sub-sampling receiver design for a radio-frequency (RF) application, ADC/DAC's power supply noise from the regulator is critical because the amount of ADC/DAC's power supply noise contributes the wrong data.

Power-supply noise is typically illustrated as voltage ripple riding on top of a DC voltage. Furthermore, the power-supply noise, in an instance, may be quantified as an AC signal with amplitude (Voltage ripple) and frequency (switching frequency of the converter).

As recent ADC/DAC requires more power to get a higher resolution of 12 bits or more, a complete ADC/DAC power system must be efficient, tightly regulated, fit on an already crowded PCB and produce output noise that matches the sensitivity of the load.

Further, ADC/DAC for RF application uses the frequency range from 100 kHz to 15 MHz.

Therefore, there is a need for improved methods, systems, apparatuses, and devices for regulating an output of a switched mode power supply circuit configured to provide electric power to a load that may overcome one or more of the above-mentioned problems and/or limitations.

SUMMARY OF THE INVENTION

This summary is provided to introduce a selection of concepts in a simplified form, that are further described below in the Detailed Description. This summary is not intended to identify key features or essential features of the claimed subject matter. Nor is this summary intended to be used to limit the claimed subject matter's scope.

Disclosed herein is a system for regulating an output of a switched mode power supply circuit configured to provide electric power to a load, in accordance with some embodiments. Accordingly, the system may include a filter circuit. Further, a filter input end of the filter circuit may be electrically coupled to a power output of the switched mode power supply circuit. Further, a filter output end of the filter circuit may be electrically coupled to the load. Further, the filter circuit may be configured to suppress ripple signals at the power output of the switched mode power supply circuit. Further, the system may include a feedback sense circuit including at least one feedback input end and at least one feedback output end. Further, the at least one feedback input end may be electrically coupled to each of the filter input end and the filter output end of the filter circuit. Further, the feedback sense circuit may be configured for generating a feedback signal based on an output ripple signal at the filter input end and a DC regulation signal at the filter output end. Further, the at least one feedback output end may be configured to be electrically coupled to the switched mode power supply circuit. Further, a switching of the switched mode power supply circuit may be based on the feedback signal.

Further disclosed herein is a system for regulating an output of a switched mode power supply circuit configured to provide electric power to a load, in accordance with an exemplary embodiment. Accordingly, the system may include a filter circuit. Further, a filter input end of the filter circuit may be electrically coupled to a power output of the switched mode power supply circuit. Further, a filter output end of the filter circuit may be electrically coupled to the load. Further, the filter circuit may be configured to suppress ripple signals at the power output of the switched mode power supply circuit. Further, the system may include a feedback sense circuit including at least one feedback input end and at least one feedback output end. Further, the at least one feedback input end may be electrically coupled to each of the filter input end and the filter output end of the filter circuit. Further, the feedback sense circuit may be configured for generating a feedback signal based on an output ripple signal at the filter input end and a DC regulation signal at the filter output end. Further, the at least one feedback output end may be configured to be electrically coupled to the switched mode power supply circuit through an error amplifier. Further, the system may include the error amplifier configured for generating an amplified feedback signal based on the feedback signal. Further, an amplifier input end of the error amplifier may be electrically coupled to the at least one feedback output end. Further, an amplifier output end may be electrically coupled to the switched mode power supply circuit. Further, the switching of the switched mode power supply circuit may be based on the amplified feedback signal.

Further disclosed herein is a system for regulating an output of a switched mode power supply circuit configured to provide electric power to a load, in accordance with an exemplary embodiment. Further, the system may include a filter circuit. Further, a filter input end of the filter circuit may be electrically coupled to a power output of the switched mode power supply circuit. Further, a filter output end of the filter circuit may be electrically coupled to the load. Further, the filter circuit may be configured to suppress ripple signals at the power output of the switched mode power supply circuit. Further, the system may include a feedback sense circuit including a first feedback input end, a second feedback input end, and at least one feedback output end. Further, the first feedback input end may be electrically coupled to the filter input end through a highpass circuit including at least one resistor and at least one capacitor. Further, the second feedback input end may be electrically coupled to the filter output end through a lowpass circuit including a resistor. Further, the feedback sense circuit may be configured for generating a feedback signal based on an output ripple signal at the filter input end and a DC regulation signal at the filter output end. Further, the at least one feedback output end may be configured to be electrically coupled to the switched mode power supply circuit. Further, a switching of the switched mode power supply circuit may be based on the feedback signal.

Both the foregoing summary and the following detailed description provide examples and are explanatory only. Accordingly, the foregoing summary and the following detailed description should not be considered to be restrictive. Further, features or variations may be provided in addition to those set forth herein. For example, embodiments may be directed to various feature combinations and subcombinations described in the detailed description.

BRIEF DESCRIPTION OF DRAWINGS

The accompanying drawings, which are incorporated in and constitute a part of this disclosure, illustrate various embodiments of the present disclosure. The drawings contain representations of various trademarks and copyrights owned by the Applicants. In addition, the drawings may contain other marks owned by third parties and are being used for illustrative purposes only. All rights to various trademarks and copyrights represented herein, except those belonging to their respective owners, are vested in and the property of the applicants. The applicants retain and reserve all rights in their trademarks and copyrights included herein, and grant permission to reproduce the material only in connection with reproduction of the granted patent and for no other purpose.

Furthermore, the drawings may contain text or captions that may explain certain embodiments of the present disclosure. This text is included for illustrative, non-limiting, explanatory purposes of certain embodiments detailed in the present disclosure.

DETAILED DESCRIPTION OF THE INVENTION

Figure 1:
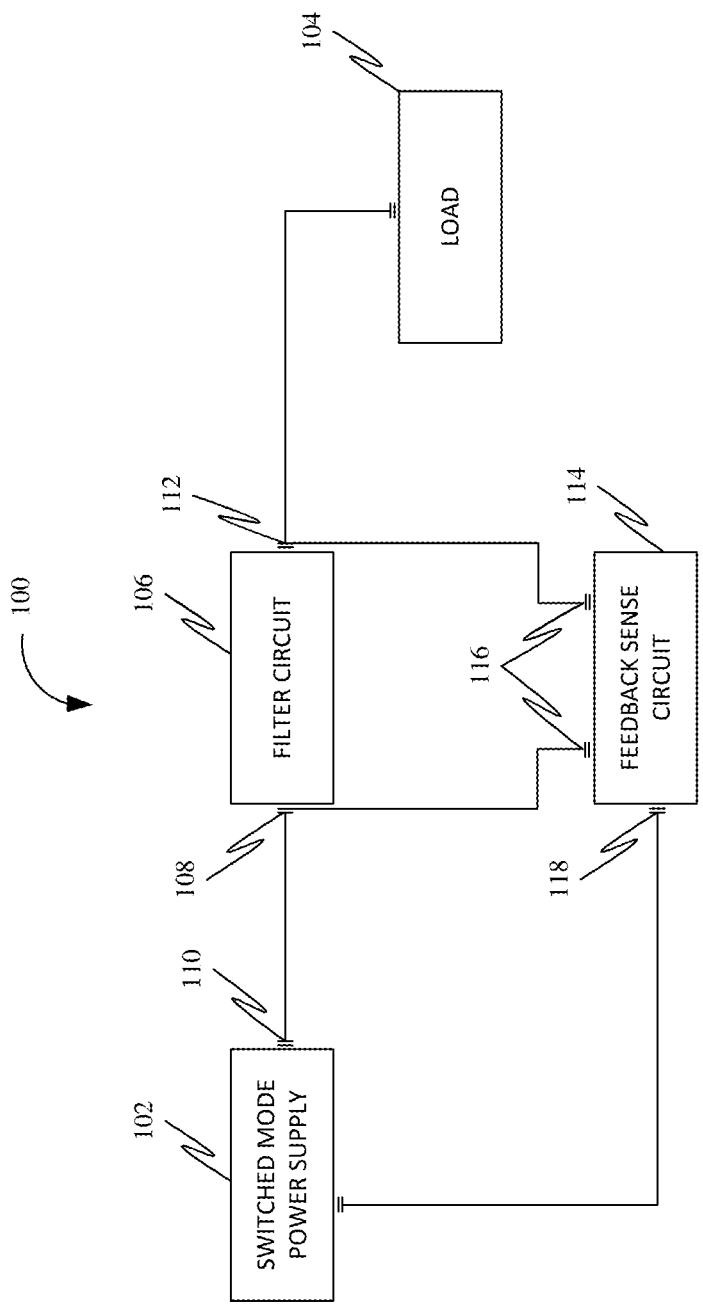
FIG. 1 is a block diagram representation of a system for regulating an output of a switched mode power supply circuit configured to provide electric power to a load, in accordance with some embodiments.

As a preliminary matter, it will readily be understood by one having ordinary skill in the relevant art that the present disclosure has broad utility and application. As should be understood, any embodiment may incorporate only one or a plurality of the above-disclosed aspects of the disclosure and may further incorporate only one or a plurality of the above-disclosed features. Furthermore, any embodiment discussed and identified as being "preferred" is considered to be part of a best mode contemplated for carrying out the embodiments of the present disclosure. Other embodiments also may be discussed for additional illustrative purposes in providing a full and enabling disclosure. Moreover, many embodiments, such as adaptations, variations, modifications, and equivalent arrangements, will be implicitly disclosed by the embodiments described herein and fall within the scope of the present disclosure.

Accordingly, while embodiments are described herein in detail in relation to one or more embodiments, it is to be understood that this disclosure is illustrative and exemplary of the present disclosure, and are made merely for the purposes of providing a full and enabling disclosure. The detailed disclosure herein of one or more embodiments is not intended, nor is to be construed, to limit the scope of patent protection afforded in any claim of a patent issuing here from, which scope is to be defined by the claims and the equivalents thereof. It is not intended that the scope of patent protection be defined by reading into any claim limitation found herein and/or issuing here from that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present disclosure. Accordingly, it is intended that the scope of patent protection is to be defined by the issued claim(s) rather than the description set forth herein.

Additionally, it is important to note that each term used herein refers to that which an ordinary artisan would understand such term to mean based on the contextual use of such term herein. To the extent that the meaning of a term used herein—as understood by the ordinary artisan based on the contextual use of such term—differs in any way from any particular dictionary definition of such term, it is intended that the meaning of the term as understood by the ordinary artisan should prevail.

Furthermore, it is important to note that, as used herein, "a" and "an" each generally denotes "at least one," but does not exclude a plurality unless the contextual use dictates otherwise. When used herein to join a list of items, "or" denotes "at least one of the items," but does not exclude a plurality of items of the list. Finally, when used herein to join a list of items, "and" denotes "all of the items of the list."

The following detailed description refers to the accompanying drawings. Wherever possible, the same reference numbers are used in the drawings and the following description to refer to the same or similar elements. While many embodiments of the disclosure may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the disclosure. Instead, the proper scope of the disclosure is defined by the claims found herein and/or issuing here from. The present disclosure contains headers. It should be understood that these headers are used as references and are not to be construed as limiting upon the subjected matter disclosed under the header.

The present disclosure includes many aspects and features. Moreover, while many aspects and features relate to, and are described in the context of systems and methods for regulating an output of a switched mode power supply circuit configured to provide electric power to a load, embodiments of the present disclosure are not limited to use only in this context.

Figure 4:
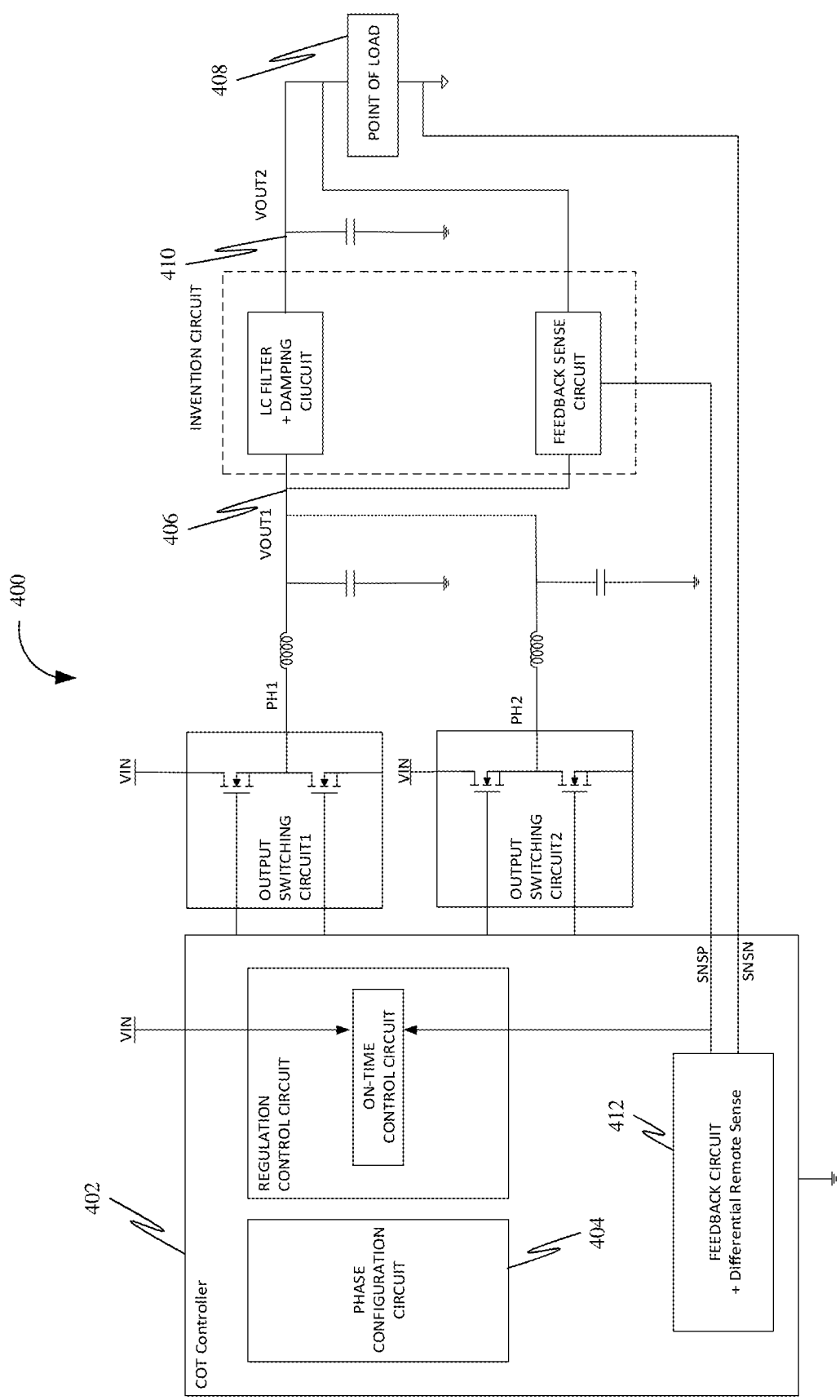
FIG. 4 is an exemplary representation of a system configured for providing electric power to at least one load (such as a point of load), in accordance with some embodiments.

Overview:

When using a high-performance analog-to-digital converter (ADC) or digital-to-analog converter (DAC) in a sampling or sub-sampling receiver design for a radio frequency (RF) application, ADC/DAC's power supply noise from the regulator is critical because the amount of ADC/DAC's power supply noise contributes to the wrong data. The present disclosure includes systems and methods that use additional LC filter, which may provide −40 dB gain to mitigate the output ripple. With reference to FIG. 4, at terminal "Vout2", an output ripple may be observed lower than 400 μV. Further, at a cut-off frequency of LC filter, the system may have a bad load transient if there may be no damping circuit. Further, present invention adopts the damping circuit to improve the load transient. Further, the system may include an internal feedback circuit. Further, the internal feedback circuit may be able to provide stability with an internal compensation. It does not have proper feedback stability for higher frequency from an infinitesimal output ripple. Further, the system may detect the output ripple signal from Vout1 and a DC regulation signal from Vout2 as the feedback sense circuit.

FIG. 4 is an exemplary representation of a system 400 configured for providing electric power to at least one load (such as a point of load 408), in accordance with some embodiments. Accordingly, a Constant On time (COT) controller 402 may have great benefits due to a better load transient for lower voltage and higher current applications such as computing CPUs, FPGAs, ASICs. However, a control fundament may require a minimum output ripple in order to be stable. Further, a Phase configuration circuit 404, in an instance, may be able to use two single bucks (buck converters) or one dual phases (for example). Further, the phase configuration circuit 404 may be more configurable with a multi-phase buck converter. Further, the Multi-phase buck converter may have advantages in terms of reduced input capacitance, reduced output capacitance, and improved load transients.

Further, a terminal voltage 406 (may be referred to as "Vout1") may be regulated by a duty ratio of D=Vout1/VIN. Further, voltage VIN, in an instance, may be input voltage. Further, a ripple on Vout1 may be too high to meet the ADC/DAC power supply even though 2 MHz switching frequency for single phase & 4 MHz switching noise for dual-phase buck converter due to an interleaved switching mechanism may reduce the output ripple significantly. Further, the system 400 may use additional LC filter, which may provide −40 dB gain to mitigate the output ripple. Further, at a filter output terminal 410 (may be referred to as Vout2), an output ripple, in an instance, may be lower than 400 μV. Further, at the cut-off frequency of LC filter, it has a bad load transient if there may be no damping circuit. Further, the system 400 may adopt the damping circuit to improve load transients. Further, the system 400 may include an Internal Feedback circuit 412. Further, the internal feedback circuit 412 may be able to provide stability with the internal compensation. It does not have proper feedback stability for higher frequency from an infinitesimal output ripple. Further, the system 400 may detect the output ripple signal from Vout1 and a DC regulation signal from Vout2 as the feedback sense circuit.

Figure 5:
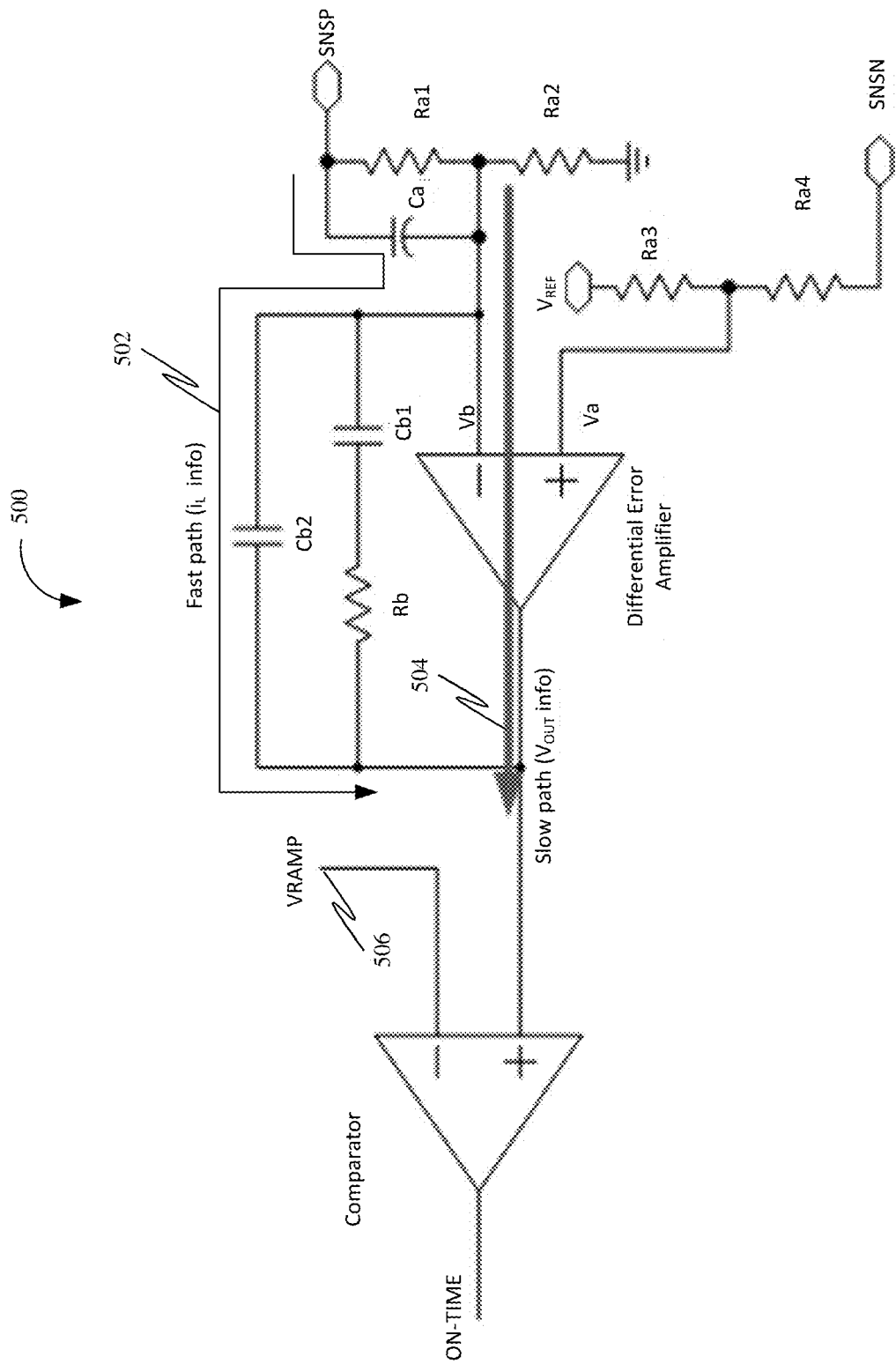
FIG. 5 is an exemplary representation of a comparator including Type-III compensator, in accordance with some embodiments.

Further, FIG. 5 is an exemplary representation of a comparator including Type-III compensator 500, in accordance with some embodiments. Accordingly, a path through the Type-III compensator 500 may include two paths, both a fast path 502 and a slow path 504. Further, the fast path 502 may provide a function of a high-pass filter to recover an inductor current ripple information from an output voltage ripple. Further, the slow path 504 may provide DC information to regulate output voltage (Vout). Further, VRAMP 506 may be generated by Vin and Vout, which may determine a duty cycle of the switching. In other words, switching on time may be determined by comparing VRAMP 506 and error amplified feedback signal. Further, a differential error amplifier remote output voltage sensing, in an instance, may improve point of load regulation by detecting the differential voltage on point of load directly, ensuring best voltage regulation at the load, regardless of power plane impedance. Further, with reference to equation 1 below, a sum of a magnitude associated with Ra1 & Ra2 and a sum of magnitude associated with Ra3 & Ra4, in an instance, may provide a magnitude associated with a high impedance differential sense resistor.

$$Ra1+Ra2=Ra3+Ra4=\text{high impedance differential sense resistor} \qquad (1)$$

Figure 6:
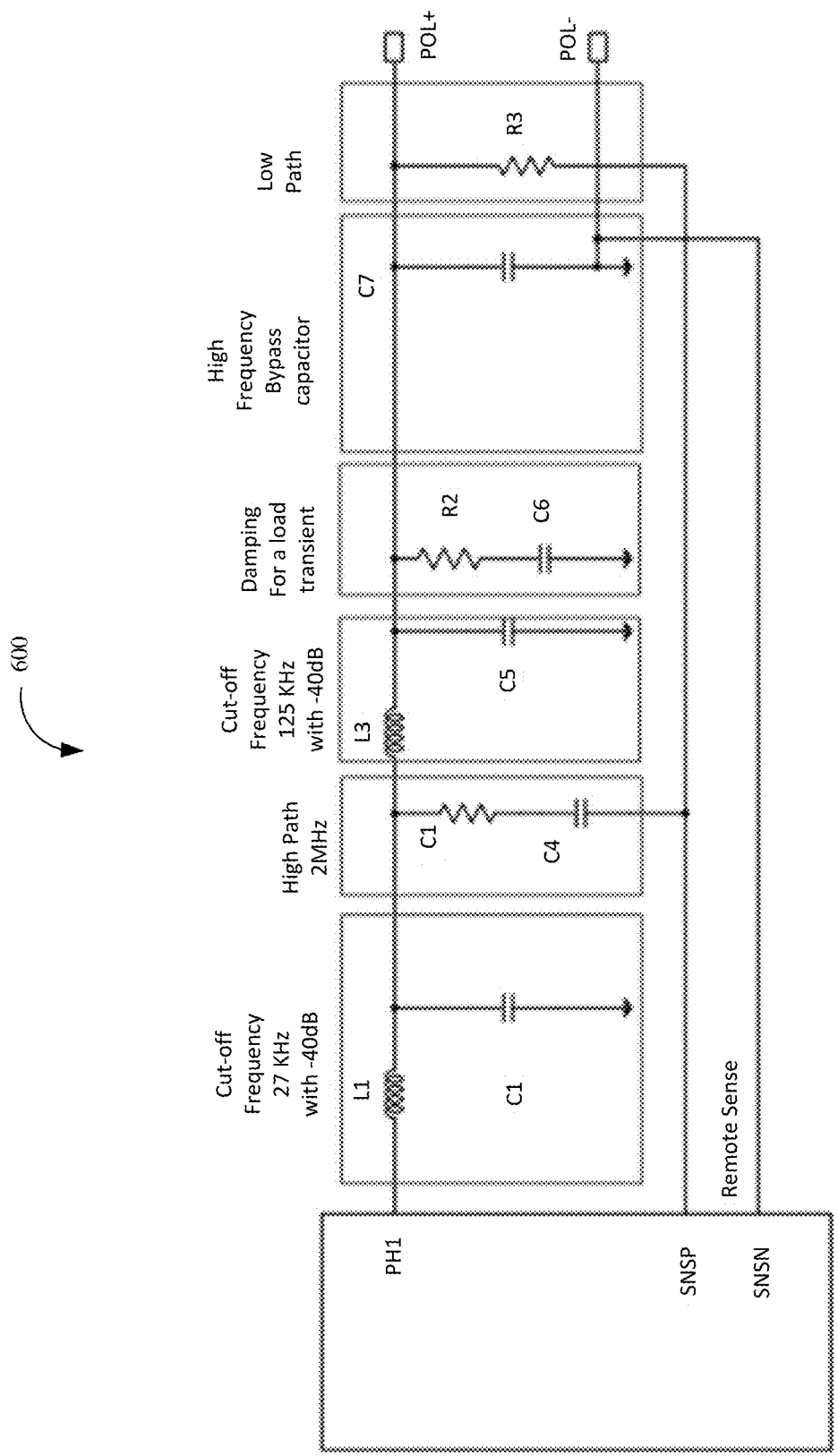
FIG. 6 is an exemplary representation of an invention circuit for single phase, in accordance with some embodiments.

Further, FIG. 6 is an exemplary representation of an invention circuit 600 for single phase, in accordance with some embodiments. Further, with reference to FIG. 6, the invention 600 circuit for single phase may include electrical components (such as, but not limited to, resistors, capacitors, and inductors) with magnitudes that may be calculated based on equations below (such as equation number 2, 3, 4, and 5).

$$f_{LC} = \frac{1}{2\pi\sqrt{L_1 \times C_1}} = 27 \text{ kHz}, \quad (2)$$

$$f_{SW} \text{ (switching Frequency)} \cong 100 \times f_{LC} \cong 2 \text{ MHz}$$

$$f_{R1C4} = \frac{1}{2\pi R1 C1} = 2 \text{ MHz to detect the ripple voltage on } C1 \quad (3)$$

$$R3 = 1 \text{ KHZ to isolate from High} \quad (4)$$

path and monitor DC output voltage on $P+$ $$f_{L3C5} = \frac{1}{2\pi\sqrt{L_3 \times C_5}} = 125 \text{ kHz}, \quad (5)$$

$$L_3 = 50 \text{ nH (0805 size, } DCR = 20 \text{ mohm)}$$

Figure 7:
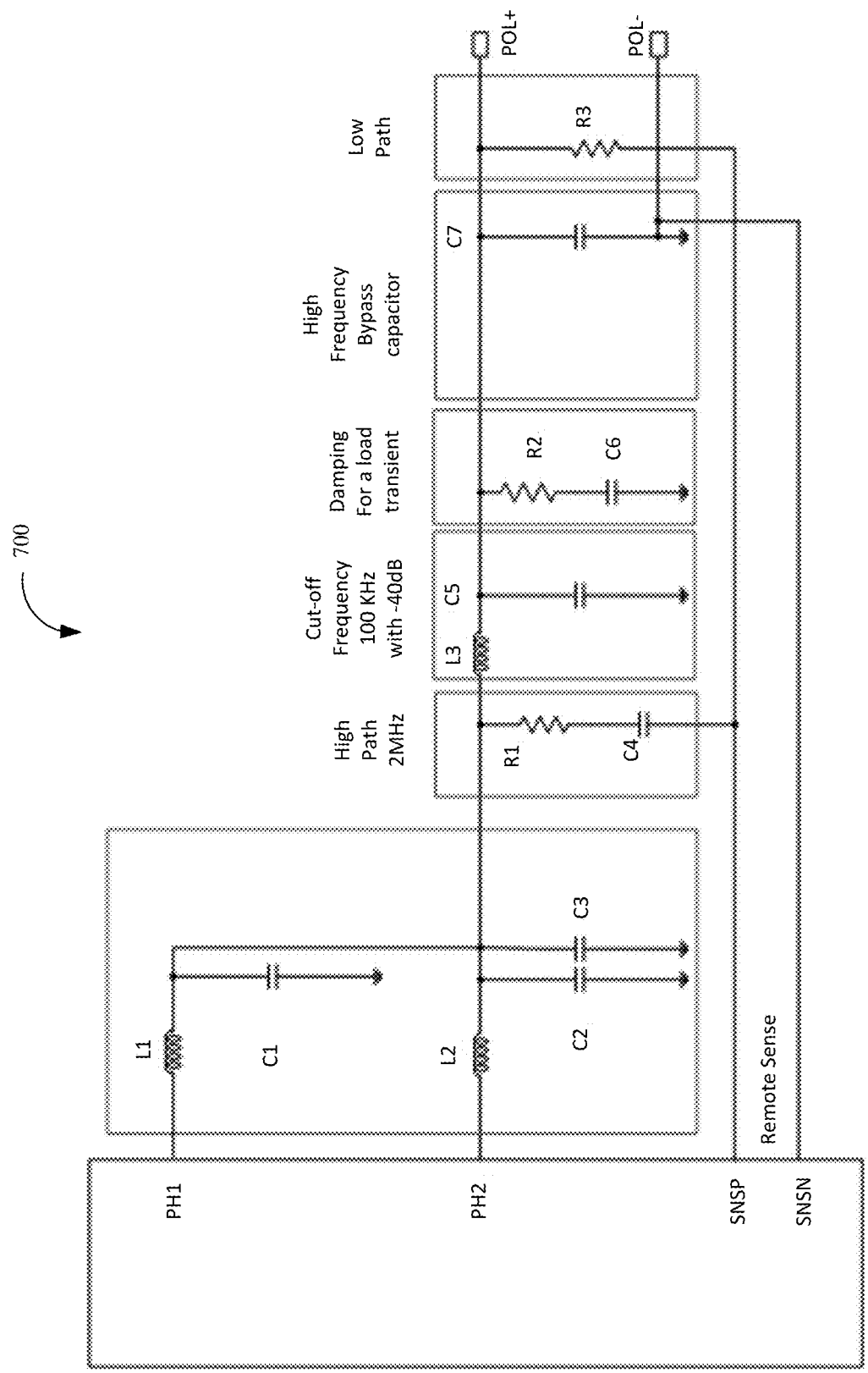
FIG. 7 is an exemplary representation of an invention circuit for dual phases, in accordance with some embodiments.

Further, FIG. 7 is an exemplary representation of an invention circuit 700 for dual phases, in accordance with some embodiments. Further, with reference to FIG. 7, the invention circuit 700 for dual phase may include electrical components (such as, but not limited to, resistors, capacitors, and inductors) with magnitudes that may be calculated based on equations below (such as equation number 6, 7, 8, and 9)

$$f_{LC} = \frac{1}{2\pi\sqrt{L_1 \times C_1}} = \frac{1}{2\pi\sqrt{L_2 \times C_2}} = 27 \text{ kHz}, \quad (6)$$

$$f_{SW} \text{ (switching Frequency)} \times 2 \cong 100 \times f_{LC} \cong 4 \text{ MHz due to Dual Phase}$$

$$f_{R1C4} = \frac{1}{2\pi R1 C1} = 2 \text{ MHz to detect the ripple voltage on } C1 \quad (7)$$

$$R3 = 1 \text{ KHZ to isolate from High} \quad (8)$$

path and monitor DC output voltage on $POL+$ $$f_{L3C5} = \frac{1}{2\pi\sqrt{L_3 \times C_5}} = 125 \text{ kHz}, \quad (9)$$

$$L_3 = 50 \text{ nH (0805 size, } DCR = 20 \text{ mohm)}$$

Figure 8:
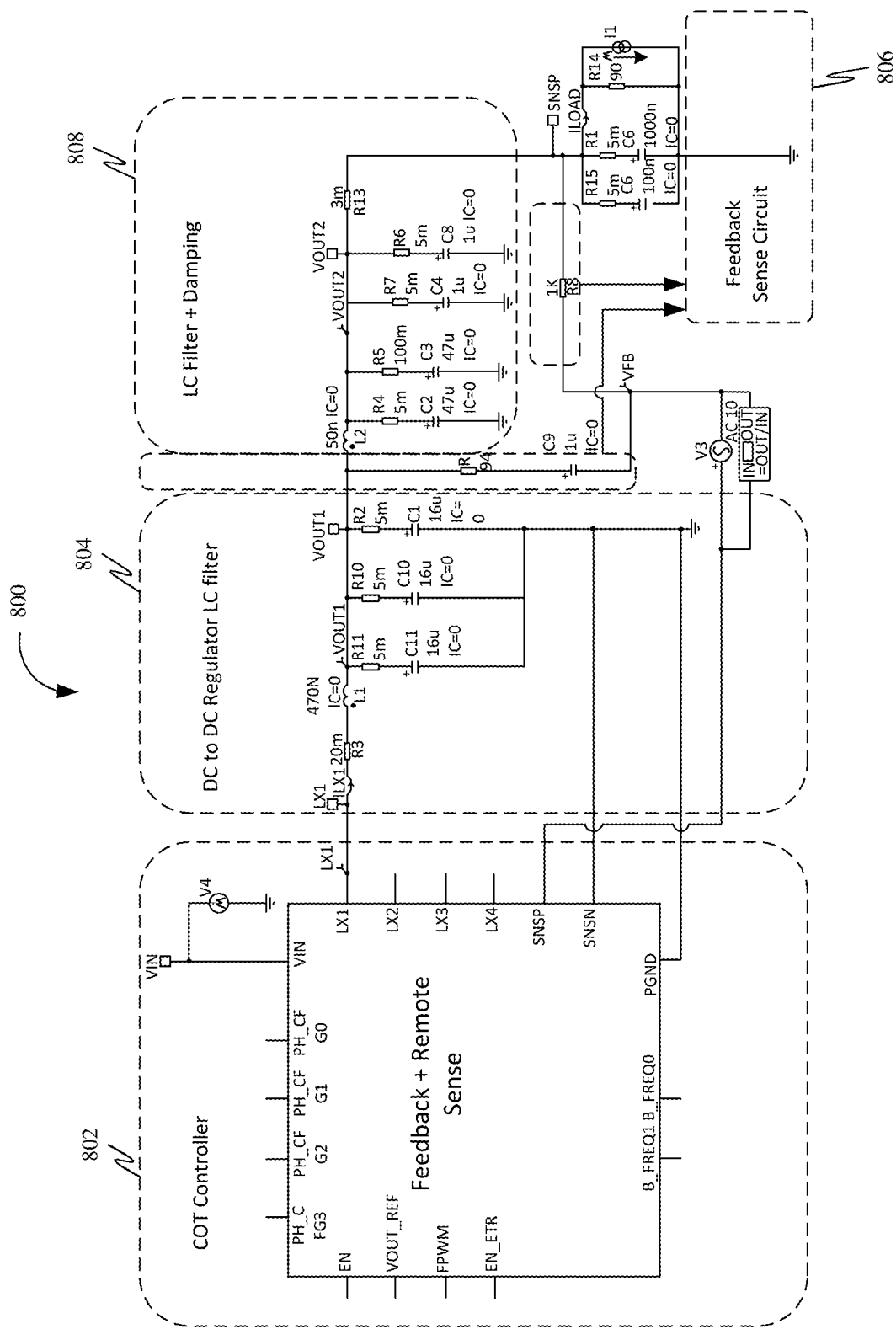
FIG. 8 is an exemplary representation of a simulation circuit (single phase circuit) associated with a system configured to provide electric power to a load, in accordance with some embodiments.

Further, FIG. 8 is an exemplary representation of a simulation circuit (single phase circuit) associated with a system 800 configured to provide electric power to a load, in accordance with some embodiments. Accordingly, the system 800 may include a Constant On Time (COT) controller 802 electrically coupled with a DC to DC regulator LC filter 804. Further, the DC to Dc regulator LC filter 804, in an instance, may be electrically coupled with a feedback sense circuit 806, and an LC filter and damping circuit 808.

Figure 9:
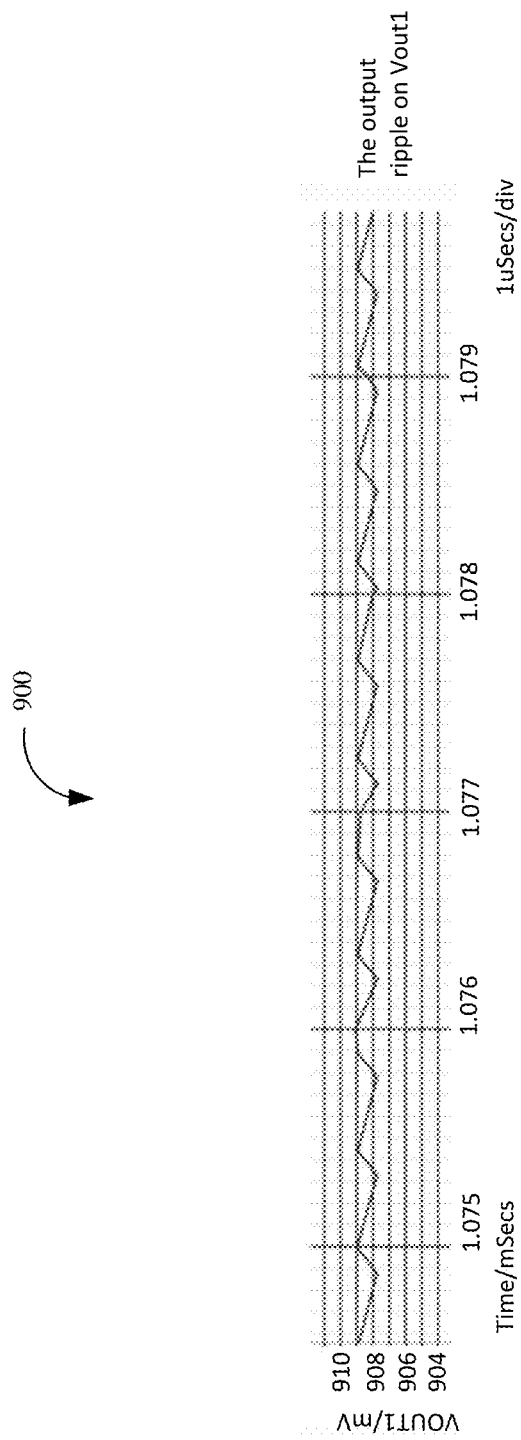
FIG. 9 is an exemplary representation of a simulation result with start up waveform at 9V/2 A, in accordance with some embodiments.

Further, FIG. 9 is an exemplary representation of a simulation result 900 with start up waveform at 9V/2 A, in accordance with some embodiments. Accordingly, the simulation result 900 may provide a visual representation of a variation associated with the output ripple on Vout1.

Figure 10:
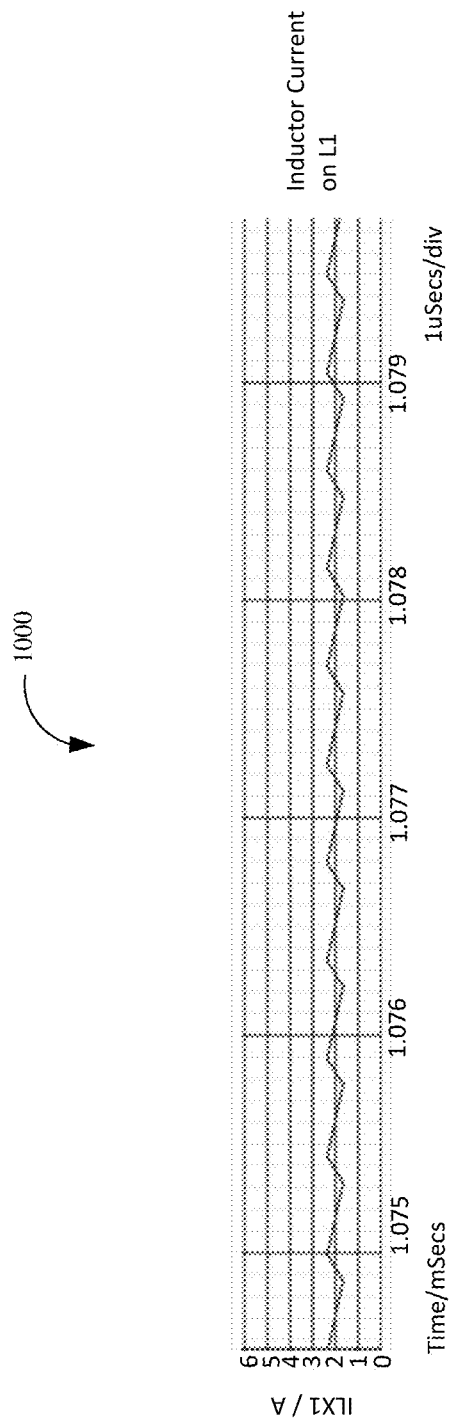
FIG. 10 is an exemplary representation of a simulation result with start up waveform at 9V/2 A, in accordance with some embodiments.

Further, FIG. 10 is an exemplary representation of a simulation result 1000 with start up waveform at 9V/2 A, in accordance with some embodiments. Accordingly, the simulation result 1000 may provide a visual representation of a variation associated with an inductor current on L1.

Figure 11:
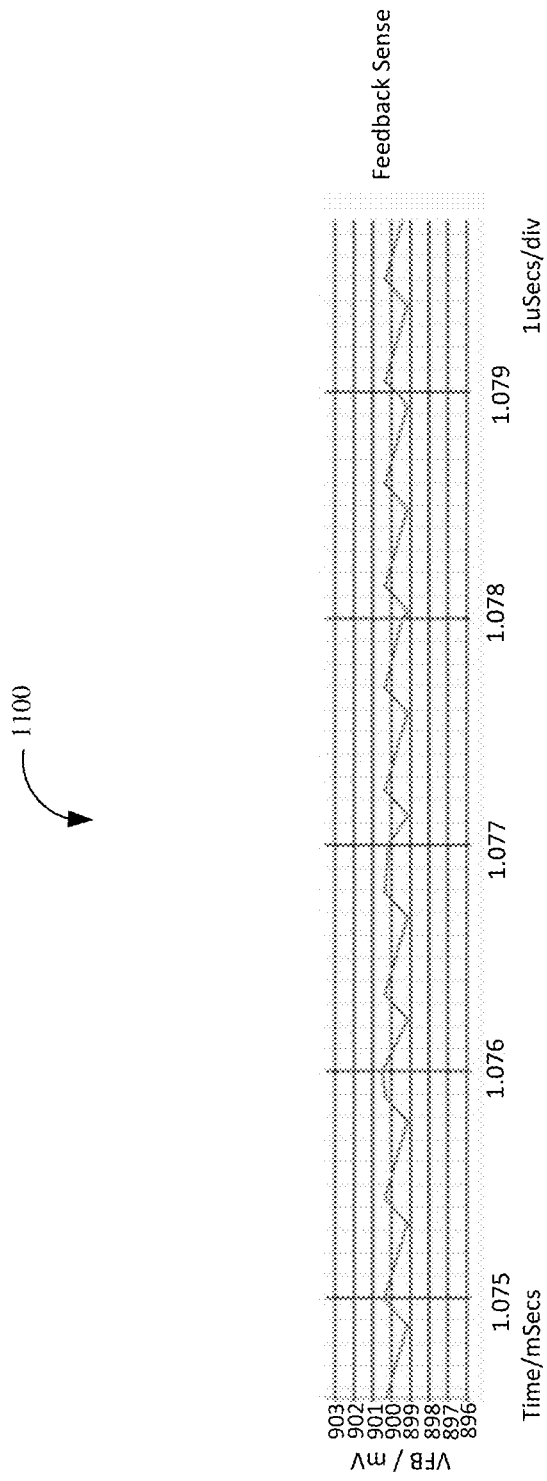
FIG. 11 is an exemplary representation of a simulation result with start up waveform at 9V/2 A, in accordance with some embodiments.

Further, FIG. 11 is an exemplary representation of a simulation result 1100 with start up waveform at 9V/2 A, in accordance with some embodiments. Accordingly, the simulation result 1100 may provide a visual representation of a variation associated with feedback sense.

Figure 12:
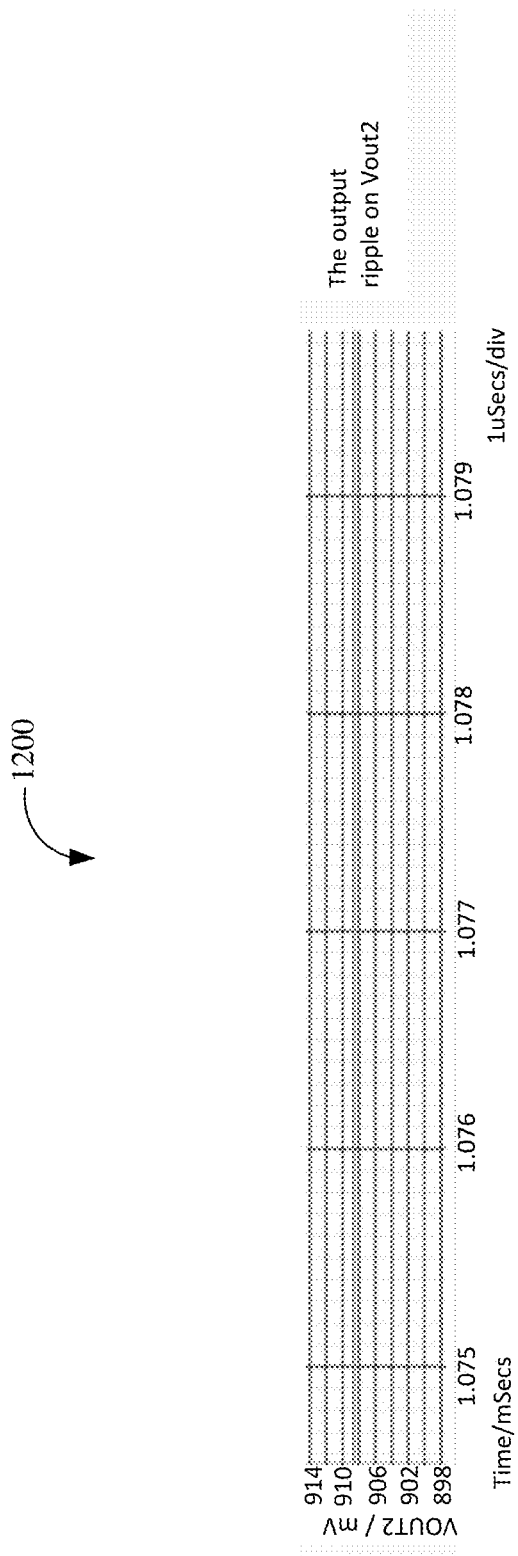
FIG. 12 is an exemplary representation of a simulation result with start up waveform at 9V/2 A, in accordance with some embodiments.

Further, FIG. 12 is an exemplary representation of a simulation result 1200 with start up waveform at 9V/2 A, in accordance with some embodiments. Accordingly, the simulation result 1200 may provide a visual representation of a variation associated with the output ripple on Vout2.

Figure 13:
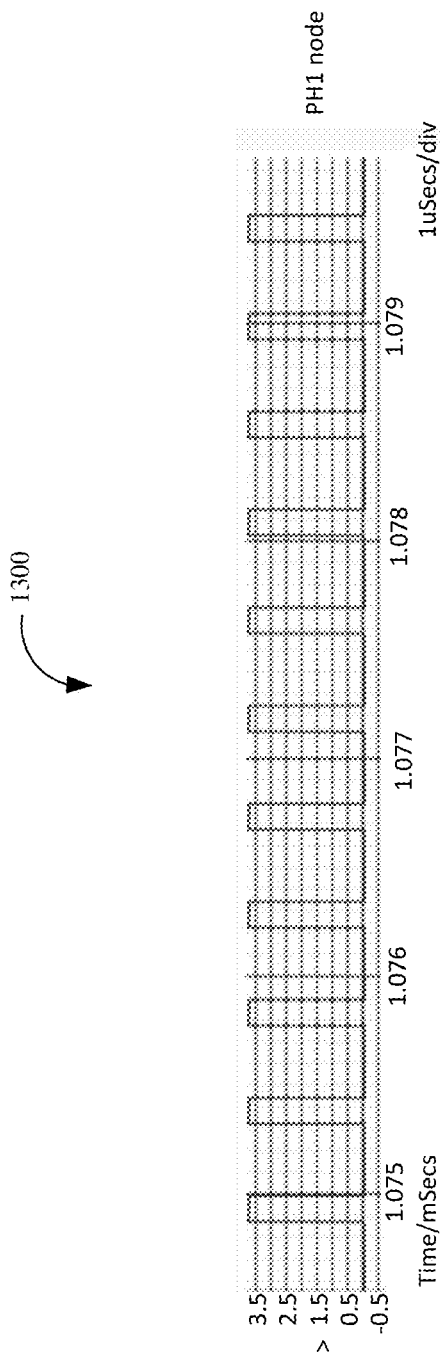
FIG. 13 is an exemplary representation of a simulation result with start up waveform at 9V/2 A, in accordance with some embodiments.

Further, FIG. 13 is an exemplary representation of a simulation result 1300 with start up waveform at 9V/2 A, in accordance with some embodiments. Accordingly, the simulation result 1300 may provide a visual representation of a variation associated with PH1 node.

Figure 14:
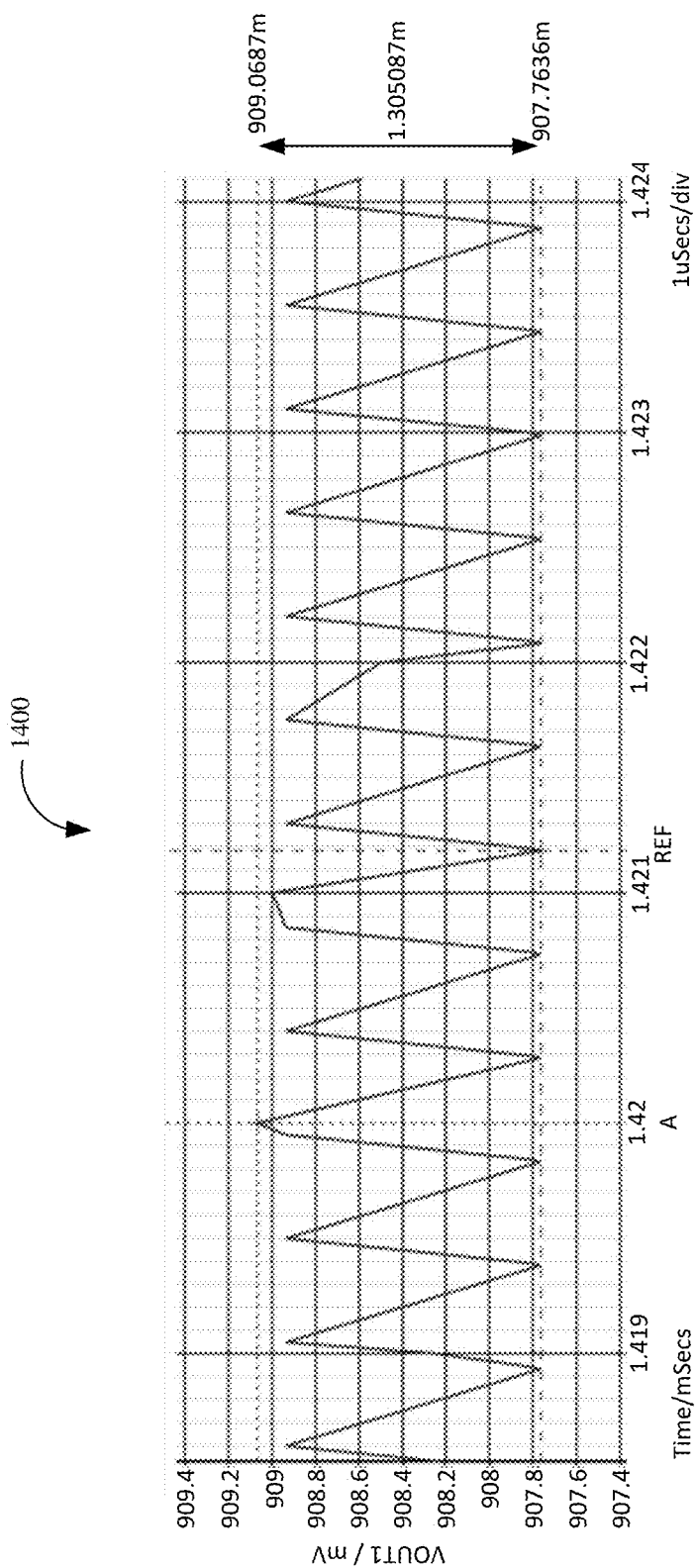
FIG. 14 is an exemplary representation of a simulation result of output ripples at 9V/2 A load without low noise circuit, in accordance with some embodiments.

Further, FIG. 14 is an exemplary representation of a simulation result 1400 of output ripples at 9V/2 A load without low noise circuit, in accordance with some embodiments. Accordingly, the simulation result 1400 may provide a visual representation of a variation associated with the output ripples. For instance, a peak to peak ripple of 1.2 mV on Vout1 may be observed.

Figure 15:
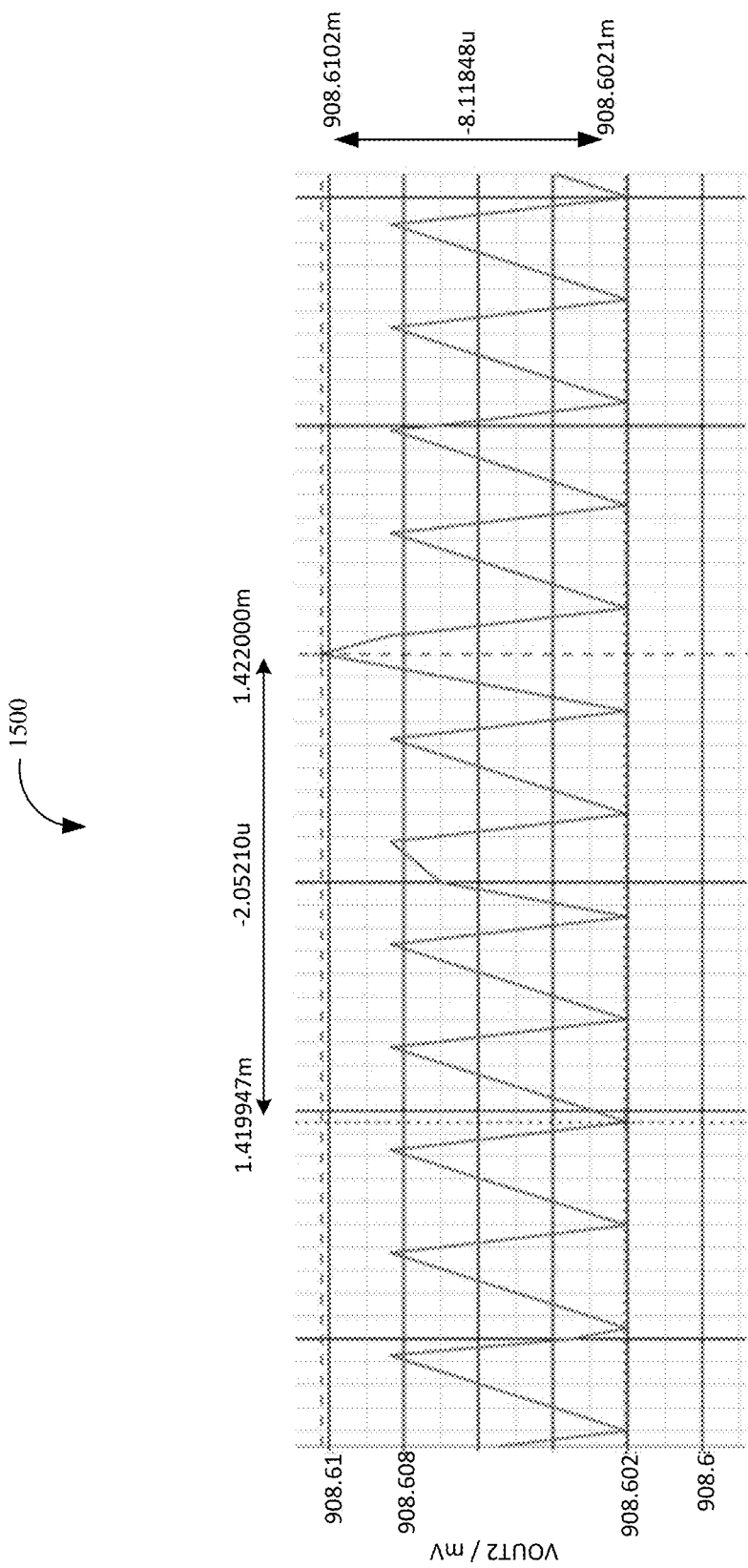
FIG. 15 is an exemplary representation of a simulation result of output ripples at 9V/2 A load with low noise circuit, in accordance with some embodiments.

Further, FIG. 15 is an exemplary representation of a simulation result 1500 of output ripples at 9V/2 A load with low noise circuit, in accordance with some embodiments. Accordingly, the simulation result 1500 may provide a visual representation of a variation associated with the output ripples. For instance, a peak to peak ripple of 8.11 micro-Volts on Vout1 may be observed.

Figure 16:
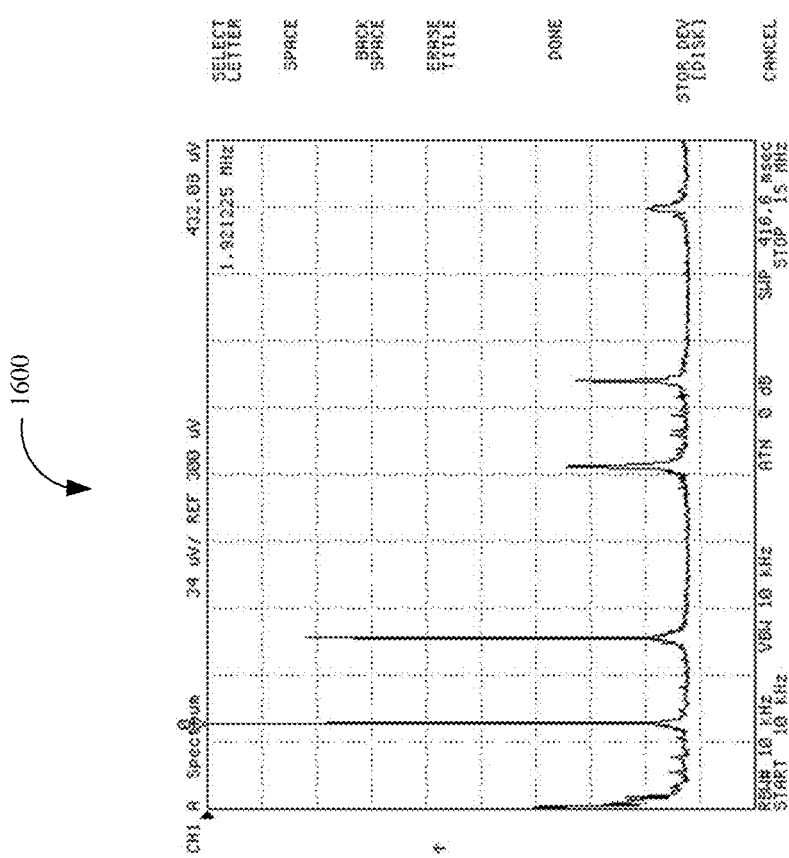
FIG. 16 is an exemplary representation of a spectrum analyzer test without invention circuit when performed for 0.925 Vout/3 A load, single phase, 10 KHz to 15 MHz spectrum analysis, in accordance with some embodiments.

Further, FIG. 16 is an exemplary representation of a spectrum analyzer test 1600 without invention circuit when performed for 0.925 Vout/3 A load, single phase, 10 KHz to 15 MHz spectrum analysis, in accordance with some embodiments. Accordingly, at 1.921 MHz switching frequency, the noise comparison may be 432 µV (without the invention circuit, rms value) and 14.586 µV (with the invention circuit, rms noise value).

Figure 17:
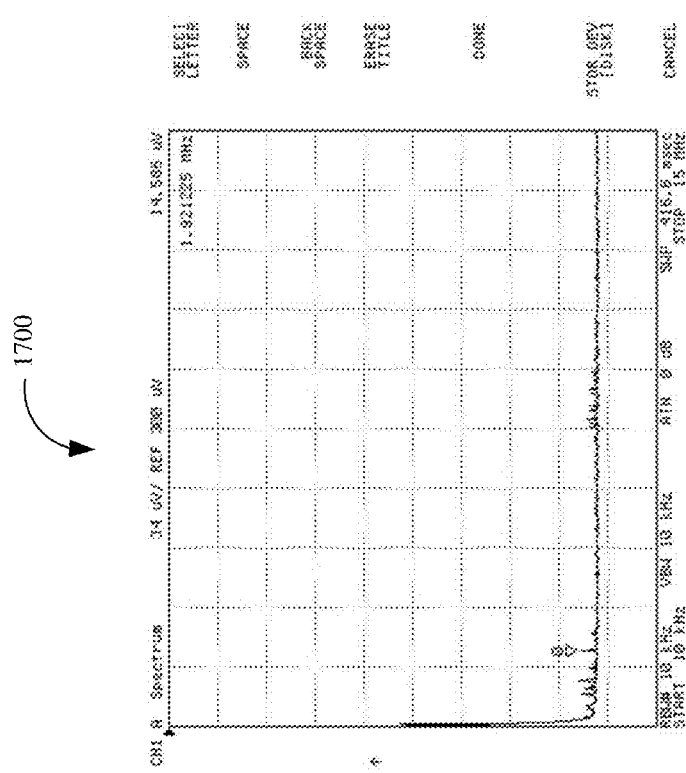
FIG. 17 is an exemplary representation of a spectrum analyzer test with invention circuit when performed for 0.925 Vout/3 A load, single phase, 10 KHz to 15 MHz spectrum analysis, in accordance with some embodiments.

Further, FIG. 17 is an exemplary representation of a spectrum analyzer test 1700 with invention circuit when performed for 0.925 Vout/3 A load, single phase, 10 KHz to 15 MHz spectrum analysis, in accordance with some embodiments. Accordingly, at 1.921 MHz switching frequency, the noise comparison may be 432 µV (without the invention circuit, rms value) and 14.586 µV (with the invention circuit, rms noise value).

Figure 18:
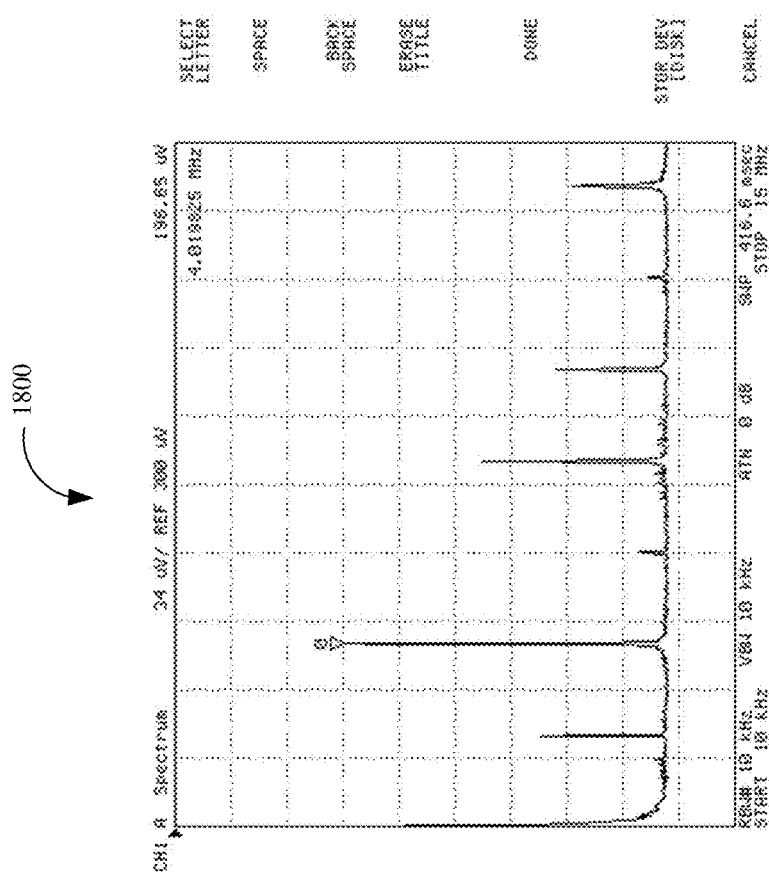
FIG. 18 is an exemplary representation of a spectrum analyzer test without invention circuit when performed for 0.925 Vout/6.5 A load, dual phase, 10 KHz to 15 MHz spectrum analysis, in accordance with some embodiments.

Further, FIG. 18 is an exemplary representation of a spectrum analyzer test 1800 without invention circuit when performed for 0.925 Vout/6.5 A load, dual phase, 10 KHz to 15 MHz spectrum analysis, in accordance with some embodiments. Accordingly, at 4.019 MHz switching frequency, the noise comparison may be 196.65 µV (without the invention circuit, rms value) and 1.63776 µV (with the invention circuit, rms noise value).

Figure 19:
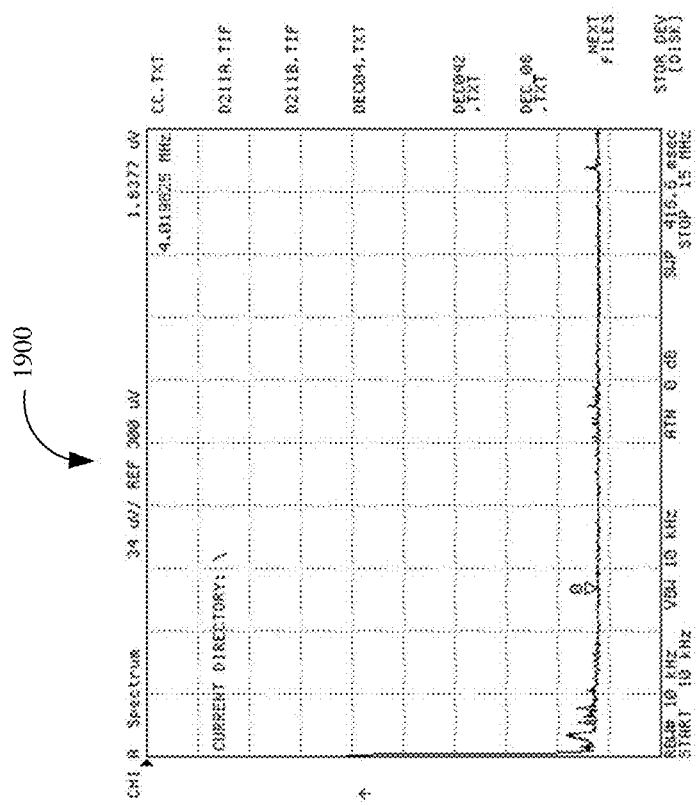
FIG. 19 is an exemplary representation of a spectrum analyzer test with invention circuit when performed for 0.925 Vout/6.5 A load, dual phase, 10 KHz to 15 MHz spectrum analysis, in accordance with some embodiments.

Further, FIG. 19 is an exemplary representation of a spectrum analyzer test 1900 with invention circuit when performed for 0.925 Vout/6.5 A load, dual phase, 10 KHz to 15 MHz spectrum analysis, in accordance with some embodiments. Accordingly, at 4.019 MHz switching frequency, the noise comparison may be 196.65 µV (without the invention circuit, rms value) and 1.63776 µV (with the invention circuit, rms noise value).

Figure 20:
FIG. 20 is an exemplary representation of a regulation tolerance test for single phase when performed for 0.925 Vout/3.5 A load, in accordance with some embodiments.

Further, FIG. 20 is an exemplary representation of a regulation tolerance test 2000 for single phase when performed for 0.925 Vout/3.5 A load, in accordance with some embodiments.

Figure 21:
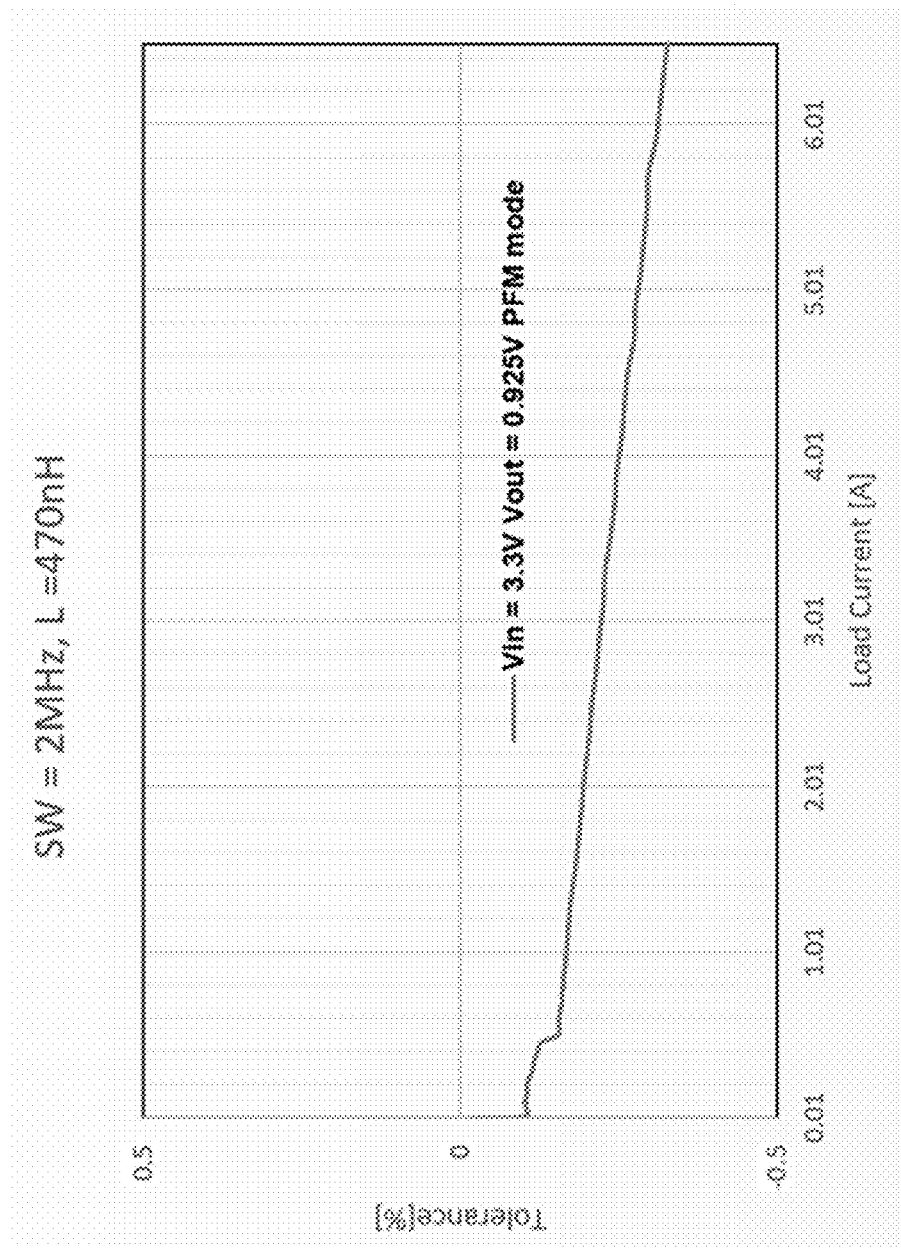
FIG. 21 is an exemplary representation of a regulation tolerance test for dual phases when performed for 0.925 Vout/6.5 A load, in accordance with some embodiments.

Further, FIG. 21 is an exemplary representation of a regulation tolerance test 2100 for dual phases when performed for 0.925 Vout/6.5 A load, in accordance with some embodiments.

Further, as the ADC/DAC needs the sophisticated performance within a limited space, the ADC/DAC may demand higher power with low profile, eventually looking for higher efficiency to cool down the system. Further, the present invention circuit may achieve high performance for the ADC/DAC power system by providing high efficiency, tightly well regulation, quiet output noise under a cost effective solution.

FIG. 1 is a block diagram representation of a system 100 for regulating an output of a switched mode power supply circuit 102 configured to provide electric power to a load 104, in accordance with some embodiments. Accordingly, the system 100 may include a filter circuit 106. Further, a filter input end 108 of the filter circuit 106 may be electrically coupled to a power output 110 of the switched mode power supply circuit 102. Further, a filter output end 112 of the filter circuit 106 may be electrically coupled to the load 104. In some embodiments, the load 104 may include at least one of an Analog-to-Digital Converter (ADC) and a Digital-to-Analog Converter (DAC). Further, the filter circuit 106 may be configured to suppress ripple signals at the power output 110 of the switched mode power supply circuit 102. In some embodiments, the filter circuit 106 may include an LC filter. Further, in some embodiments, the LC filter may be characterized by a gain of −40 dB. Further, in some embodiments, an amplitude of the ripple signals at the power output may be lower than 400 micro-Volts. In some embodiments, the switched mode power supply circuit 102 may include a buck converter circuit. Further, in some embodiments, the switched mode power supply circuit 102 may include a multi-phase buck converter circuit. Further, in some embodiments, the switched mode power supply circuit 102 may include a plurality of single phase buck converter circuits. Further, in some embodiments, the switched mode power supply circuit 102 may include a Constant On Time (COT) buck converter circuit.

Further, the system 100 may include a feedback sense circuit 114 including at least one feedback input end 116 and at least one feedback output end 118. Further, the at least one feedback input end 116 may be electrically coupled to each of the filter input end 108 and the filter output end 112 of the filter circuit 106. Further, the feedback sense circuit 114 may be configured for generating a feedback signal based on an output ripple signal at the filter input end 108 and a DC regulation signal at the filter output end 112. Further, the at least one feedback output end 118 may be configured to be electrically coupled to the switched mode power supply circuit 102. Further, a switching of the switched mode power supply circuit 102 may be based on the feedback signal. Further, in some embodiments, a duty-cycle of the switching corresponding to the switched mode power supply circuit 102 may be based on the feedback signal.

In some embodiments, a first feedback input end may be electrically coupled to the filter input end 108 through a high-pass circuit including at least one resistor and at least one capacitor. Further, a second feedback input end may be electrically coupled to the filter output end 112 through a low-pass circuit including a resistor.

In some embodiments, the system 100 may further include an error amplifier configured for generating an amplified feedback signal based on the feedback signal. Further, an amplifier input end of the error amplifier may be electrically coupled to the at least one feedback output end 118. Further, an amplifier output end may be electrically coupled to the switched mode power supply circuit 102. Further, the switching of the switched mode power supply circuit 102 may be based on the amplified feedback signal.

Figure 2:
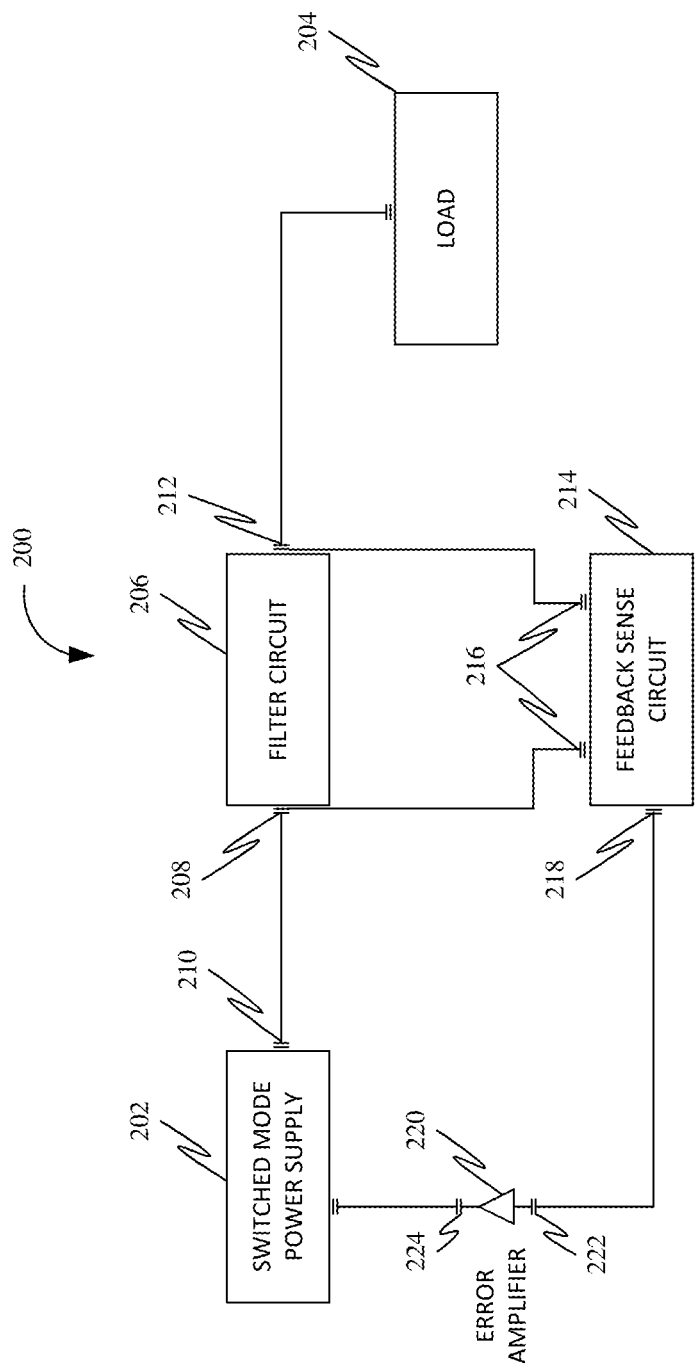
FIG. 2 is a block diagram representation of a system for regulating an output of a switched mode power supply circuit configured to provide electric power to a load, in accordance with an exemplary embodiment.

FIG. 2 is a block diagram representation of a system 200 for regulating an output of a switched mode power supply circuit 202 configured to provide electric power to a load 204, in accordance with an exemplary embodiment. Accordingly, the system 200 may include a filter circuit 206. Further, a filter input end 208 of the filter circuit 206 may be electrically coupled to a power output 210 of the switched mode power supply circuit 202. Further, a filter output end 212 of the filter circuit 206 may be electrically coupled to the load 204. Further, the filter circuit 206 may be configured to suppress ripple signals at the power output 210 of the switched mode power supply circuit 202. Further, in some embodiments, the filter circuit 206 may include an LC filter. Further, in some embodiments, the LC filter may be characterized by a gain of −40 dB. Further, in some embodiments, an amplitude of the ripple signals at the power output may be lower than 400 micro-Volts. Further, in some embodiments, the switched mode power supply circuit 202 may include at least one of a multi-phase buck converter circuit, a plurality of single phase buck converter circuits, and a Constant On Time (COT) buck converter circuit.

Further, the system 200 may include a feedback sense circuit 214 including at least one feedback input end 216 and at least one feedback output end 218. Further, the at least one feedback input end 216 may be electrically coupled to each of the filter input end 208 and the filter output end 212 of the filter circuit 206. Further, the feedback sense circuit 214 may be configured for generating a feedback signal based on an output ripple signal at the filter input end 208 and a DC regulation signal at the filter output end 212. Further, the at least one feedback output end 218 may be configured to be electrically coupled to the switched mode power supply circuit 202 through an error amplifier 220.

Further, the system 200 may include the error amplifier 220 configured for generating an amplified feedback signal based on the feedback signal. Further, an amplifier input end 222 of the error amplifier 220 may be electrically coupled to the at least one feedback output end 218. Further, an amplifier output end 224 may be electrically coupled to the switched mode power supply circuit 202. Further, the switching of the switched mode power supply circuit 202 may be based on the amplified feedback signal. Further, in some embodiments, a duty-cycle of the switching corresponding to the switched mode power supply circuit 202 may be based on the amplified feedback signal.

Figure 3:
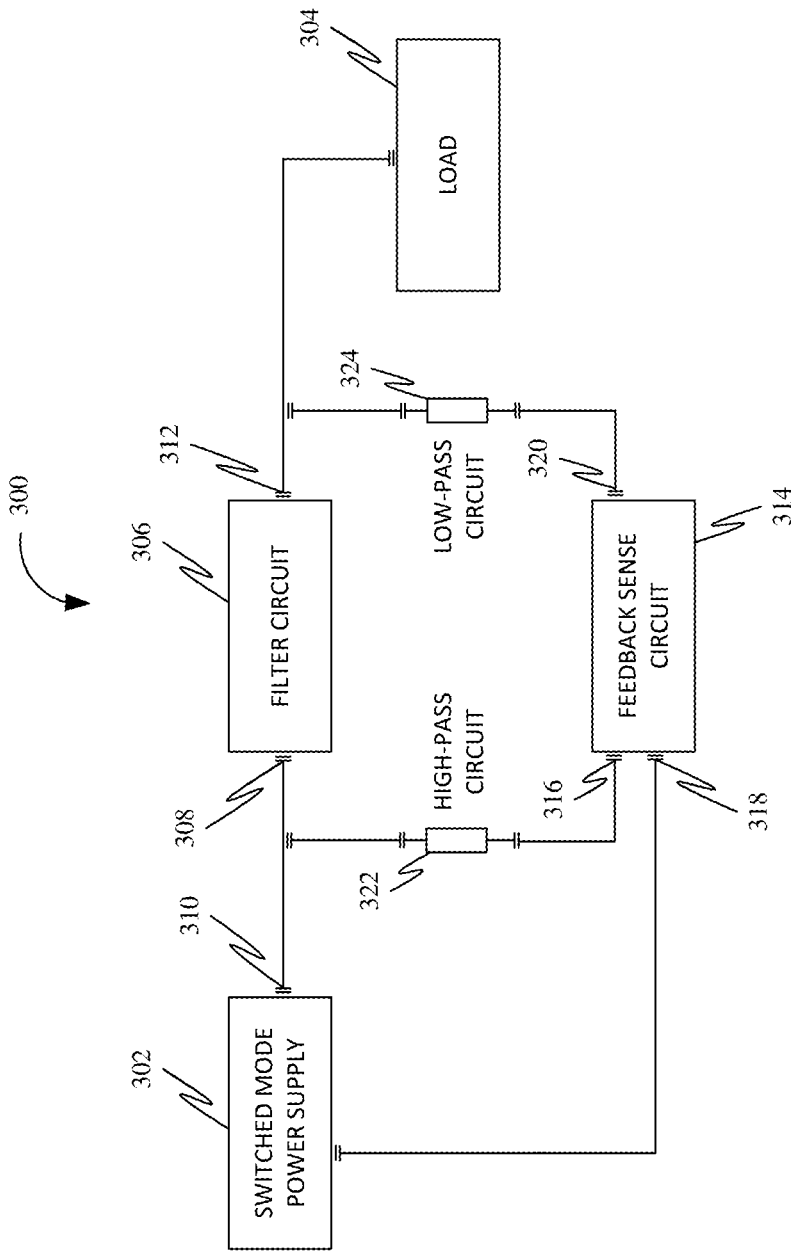
FIG. 3 is a block diagram representation of a system for regulating an output of a switched mode power supply circuit configured to provide electric power to a load, in accordance with an exemplary embodiment.

FIG. 3 is a block diagram representation of a system 300 for regulating an output of a switched mode power supply circuit 302 configured to provide electric power to a load 304, in accordance with an exemplary embodiment. Further, the system 300 may include a filter circuit 306. Further, a filter input end 308 of the filter circuit 306 may be electrically coupled to a power output 310 of the switched mode power supply circuit 302. Further, a filter output end 312 of the filter circuit 306 may be electrically coupled to the load 304. Further, the filter circuit 306 may be configured to suppress ripple signals at the power output 310 of the switched mode power supply circuit 302. Further, in some embodiments, the filter circuit 306 may include an LC filter. Further, in some embodiments, the LC filter may be characterized by a gain of −40 dB. Further, in some embodiments, an amplitude of the ripple signals at the power output may be lower than 400 micro-Volts. Further, in some embodiments, the switched mode power supply circuit 302 may include at least one of a multi-phase buck converter circuit, a plurality of single phase buck converter circuits, and a Constant On Time (COT) buck converter circuit.

Further, the system 300 may include a feedback sense circuit 314 including a first feedback input end 316, a second feedback input end 320, and at least one feedback output end 318. Further, the first feedback input 316 end may be electrically coupled to the filter input end 308 through a high-pass circuit 322 including at least one resistor and at least one capacitor. Further, the second feedback input end 320 may be electrically coupled to the filter output end 312 through a low-pass circuit 324 including a resistor. Further, the feedback sense circuit 314 may be configured for generating a feedback signal based on an output ripple signal at the filter input end 308 and a DC regulation signal at the filter output end 312. Further, the at least one feedback output end 318 may be configured to be electrically coupled to the switched mode power supply circuit 302. Further, a switching of the switched mode power supply circuit 302 may be based on the feedback signal. In some embodiments, a duty-cycle of the switching corresponding to the switched mode power supply circuit 302 may be based on the feedback signal.

Further, in an exemplary embodiment, a system configured to provide electric power to a load is disclosed. Accordingly, the system may include a filter circuit. Further, a filter input end of the filter circuit may be electrically coupled to a power output of the switched mode power supply circuit. Further, a filter output end of the filter circuit may be electrically coupled to the load. Further, the filter circuit may be configured to suppress ripple signals at the power output of the switched mode power supply circuit. Further, in some embodiments, the filter circuit may include an LC filter. Further, in some embodiments, the LC filter may be characterized by a gain of −40 dB. Further, in some embodiments, an amplitude of the ripple signals at the power output may be lower than 400 micro-Volts. Further, in some embodiments, the switched mode power supply circuit may include at least one of a multi-phase buck converter circuit, a plurality of single phase buck converter circuits, and a Constant On Time (COT) buck converter circuit. Further, the system may include a feedback sense circuit including at least one feedback input end and at least one feedback output end. Further, the at least one feedback input end may be electrically coupled to each of the filter input end and the filter output end of the filter circuit. Further, the feedback sense circuit may be configured for generating a feedback signal based on an output ripple signal at the filter input end and a DC regulation signal at the filter output end. Further, the at least one feedback output end may be configured to be electrically coupled to the switched mode power supply circuit. Further, the system may include the switched mode power supply circuit. Further, a power input end of the switched mode power supply circuit may be electrically coupled to a power source. Further, in some embodiments, the power source may include a Direct Current (DC) source. Further, a power output end of the switched mode power supply circuit may be electrically coupled to the filter input end of the filter circuit. Further, the switched mode power supply circuit may include a switching circuit configured to perform voltage conversion from an input voltage at the power input end to an output voltage at the power output end. Further, a switching of the switching circuit may be based on the feedback signal. In some embodiments, a duty-cycle of the switching corresponding to the switching circuit may be based on the feedback signal. Further, in some embodiments, the power source may include an Alternating Current (AC) source. Accordingly, the system may further include a rectifier configured to provide a DC power by rectifying an AC power from the AC source. Further, a first end of the rectifier may be electrically coupled with the AC source and a second end of the rectifier may be electrically coupled with the power input end of the switched mode power supply circuit.

Further, in another exemplary embodiment, an electronic device may include a system configured for providing electric power to at least one load. Accordingly, the electronic device, in an instance, may include devices such as, but not limited to, a smartphone, a smartwatch, a computing device, a display device, a communication device, and/or any electronic device that may include one or more electronic components. Further, the at least one load, in an instance, may include electrical and/or electronic components associated with the electronic device, which may need a regulated electrical supply for operation. For instance, the load may include (but not limited to) a microprocessor chip, a camera module, a display module, a light module, and so on. Further, the system may include a filter circuit. Further, a filter input end of the filter circuit may be electrically coupled to a power output of the switched mode power supply circuit. Further, a filter output end of the filter circuit may be electrically coupled to the at least one load. Further, the filter circuit may be configured to suppress ripple signals at the power output of the switched mode power supply circuit. Further, in some embodiments, the filter circuit may include an LC filter. Further, in some embodiments, the LC filter may be characterized by a gain of −40 dB. Further, in some embodiments, an amplitude of the ripple signals at the power output may be lower than 400 micro-Volts. Further, the system may include a feedback sense circuit including at least one feedback input end and at least one feedback output end. Further, the at least one feedback input end may be electrically coupled to each of the filter input end and the filter output end of the filter circuit. Further, the feedback sense circuit may be configured for generating a feedback signal based on an output ripple signal at the filter input end and a DC regulation signal at the filter output end. Further, the at least one feedback output end may be configured to be electrically coupled to the switched mode power supply circuit. Further, the system may include the switched mode power supply circuit. Further, a power input end of the switched mode power supply circuit may be electrically coupled to a power source. Further, in some embodiments, the power source may include a Direct Current (DC) source. For instance, the power source may include a battery that may be embedded within the electronic device. Further, a power output end of the switched mode power supply circuit may be electrically coupled to the filter input end of the filter circuit. Further, the switched mode power supply circuit may include a switching circuit configured to perform voltage conversion from an input voltage at the power input end to an output voltage at the power output end. Further, a switching of the switching circuit may be based on the feedback signal. In some embodiments, a duty-cycle of the switching corresponding to the switching circuit may be based on the feedback signal. Further, in some embodiments, the power source may include an Alternating Current (AC) source. Accordingly, the system may further include a rectifier configured to provide a DC power by rectifying an AC power from the AC source. Further, a first end of the rectifier may be electrically coupled with the AC source and a second end of the rectifier may be electrically coupled with the power input end of the switched mode power supply circuit.

Although the present disclosure has been explained in relation to its preferred embodiment, it is to be understood that many other possible modifications and variations can be made without departing from the spirit and scope of the disclosure.

What is claimed is:

1. A system for regulating an output of a switched mode power supply circuit configured to provide electric power to a load, the system comprising:
a filter circuit, wherein a filter input end of the filter circuit is electrically coupled to a power output of the switched mode power supply circuit, wherein a filter output end of the filter circuit is electrically coupled to the load, wherein the filter circuit is configured to suppress ripple signals at the power output of the switched mode power supply circuit; and
a feedback sense circuit comprising at least one feedback input end and at least one feedback output end, wherein the at least one feedback input end is electrically coupled to each of the filter input end and the filter output end of the filter circuit, wherein the feedback sense circuit is configured for generating a feedback signal based on an output ripple signal at the filter input end and a DC regulation signal at the filter output end, wherein the at least one feedback output end is configured to be electrically coupled to the switched mode power supply circuit, wherein a switching of the switched mode power supply circuit is based on the feedback signal.

2. The system of claim 1, wherein the switched mode power supply circuit comprises a buck converter circuit.

3. The system of claim 1, wherein the switched mode power supply circuit comprises a multi-phase buck converter circuit.

4. The system of claim 1, wherein the switched mode power supply circuit comprises a plurality of single phase buck converter circuits.

5. The system of claim 1, wherein the switched mode power supply circuit comprises a Constant On Time (COT) buck converter circuit.

6. The system of claim 1, wherein a duty-cycle of the switching corresponding to the switched mode power supply circuit is based on the feedback signal.

7. The system of claim 1 further comprising an error amplifier configured for generating an amplified feedback signal based on the feedback signal, wherein an amplifier input end of the error amplifier is electrically coupled to the at least one feedback output end, wherein an amplifier output end is electrically coupled to the switched mode power supply circuit, wherein the switching of the switched mode power supply circuit is based on the amplified feedback signal.

8. The system of claim 1, wherein a first feedback input end is electrically coupled to the filter input end through a high-pass circuit comprising at least one resistor and at least one capacitor, wherein a second feedback input end is electrically coupled to the filter output end through a low-pass circuit comprising a resistor.

9. The system of claim 1, wherein the filter circuit comprises an LC filter.

10. The system of claim 9, wherein the LC filter is characterized by a gain of −40 dB.

11. The system of claim 1, wherein an amplitude of the ripple signals at the power output is lower than 400 microVolts.

12. The system of claim 1, wherein the load comprises at least one of an Analog-to-Digital Converter (ADC) and a Digital-to-Analog Converter (DAC).

13. A system for regulating an output of a switched mode power supply circuit configured to provide electric power to a load, the system comprising:
a filter circuit, wherein a filter input end of the filter circuit is electrically coupled to a power output of the switched mode power supply circuit, wherein a filter output end of the filter circuit is electrically coupled to the load, wherein the filter circuit is configured to suppress ripple signals at the power output of the switched mode power supply circuit;
a feedback sense circuit comprising at least one feedback input end and at least one feedback output end, wherein the at least one feedback input end is electrically coupled to each of the filter input end and the filter output end of the filter circuit, wherein the feedback sense circuit is configured for generating a feedback signal based on an output ripple signal at the filter input end and a DC regulation signal at the filter output end, wherein the at least one feedback output end is configured to be electrically coupled to the switched mode power supply circuit through an error amplifier; and
the error amplifier configured for generating an amplified feedback signal based on the feedback signal, wherein an amplifier input end of the error amplifier is electrically coupled to the at least one feedback output end, wherein an amplifier output end is electrically coupled to the switched mode power supply circuit, wherein the switching of the switched mode power supply circuit is based on the amplified feedback signal.

14. The system of claim 13, wherein the switched mode power supply circuit comprises at least one of a multi-phase buck converter circuit, a plurality of single phase buck converter circuits, and a Constant On Time (COT) buck converter circuit.

15. The system of claim 13, wherein a duty-cycle of the switching corresponding to the switched mode power supply circuit is based on the amplified feedback signal.

16. The system of claim 13, wherein the filter circuit comprises an LC filter.

17. A system for regulating an output of a switched mode power supply circuit configured to provide electric power to a load, the system comprising:
a filter circuit, wherein a filter input end of the filter circuit is electrically coupled to a power output of the switched mode power supply circuit, wherein a filter output end of the filter circuit is electrically coupled to the load, wherein the filter circuit is configured to suppress ripple signals at the power output of the switched mode power supply circuit; and
a feedback sense circuit comprising a first feedback input end, a second feedback input end, and at least one feedback output end, wherein the first feedback input end is electrically coupled to the filter input end through a high-pass circuit comprising at least one resistor and at least one capacitor, wherein the second feedback input end is electrically coupled to the filter output end through a low-pass circuit comprising a resistor, wherein the feedback sense circuit is configured for generating a feedback signal based on an output ripple signal at the filter input end and a DC regulation signal at the filter output end, wherein the at least one feedback output end is configured to be electrically coupled to the switched mode power supply circuit, wherein a switching of the switched mode power supply circuit is based on the feedback signal.

18. The system of claim 17, wherein the switched mode power supply circuit comprises at least one of a multi-phase buck converter circuit, a plurality of single phase buck converter circuits, and a Constant On Time (COT) buck converter circuit.

19. The system of claim 17, wherein a duty-cycle of the switching corresponding to the switched mode power supply circuit is based on the feedback signal.

20. The system of claim 17, wherein the filter circuit comprises an LC filter.

* * * * *